(12) United States Patent
Matsuda et al.

(10) Patent No.: US 12,137,578 B2
(45) Date of Patent: Nov. 5, 2024

(54) DISPLAY DEVICE AND DISPLAY SYSTEM

(71) Applicant: CANON KABUSHIKI KAISHA, Tokyo (JP)

(72) Inventors: Yojiro Matsuda, Kawasaki (JP); Hidekazu Takahashi, Zama (JP); Yoshihito Harada, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/185,909

(22) Filed: Mar. 17, 2023

(65) Prior Publication Data
US 2023/0232657 A1 Jul. 20, 2023

Related U.S. Application Data

(63) Continuation of application No. 16/925,119, filed on Jul. 9, 2020, now Pat. No. 11,665,926.

(30) Foreign Application Priority Data

Jul. 12, 2019 (JP) ................................. 2019-130386

(51) Int. Cl.
*H10K 50/858* (2023.01)
*H10K 59/80* (2023.01)
*H10K 59/126* (2023.01)
*H10K 59/38* (2023.01)

(52) U.S. Cl.
CPC ......... *H10K 50/858* (2023.02); *H10K 59/126* (2023.02); *H10K 59/38* (2023.02)

(58) Field of Classification Search
CPC .. H10K 50/858; H10K 59/879; H10K 59/121; H10K 59/353
See application file for complete search history.

(56) References Cited

U.S. PATENT DOCUMENTS

| 10,153,332 B2 | 12/2018 | Ohsawa | |
|---|---|---|---|
| 2012/0092891 A1* | 4/2012 | Nakagome | G02B 6/0053 362/607 |
| 2013/0057807 A1* | 3/2013 | Goto | G02B 6/0038 362/606 |
| 2017/0263691 A1 | 9/2017 | Seo | |
| 2018/0224583 A1* | 8/2018 | Liu | G02B 5/0278 |

FOREIGN PATENT DOCUMENTS

| CN | 102479799 A | 5/2012 |
|---|---|---|
| CN | 109216584 A | 1/2019 |
| CN | 109427859 A | 3/2019 |
| CN | 109994512 A | 7/2019 |
| JP | 2007253503 A | 10/2007 |
| JP | 2009051200 A | 3/2009 |

(Continued)

*Primary Examiner* — Michele Fan
(74) *Attorney, Agent, or Firm* — Canon U.S.A., Inc. IP Division

(57) ABSTRACT

A display device includes a display region in which a plurality of pixels are arranged two-dimensionally. Each of the plurality of pixels includes a light-emitting layer and an optical member that refracts light from the light-emitting layer. In an orthographic projection of a first optical member included in a first pixel with respect to the light-emitting layer, a position of an apex of the first optical member and a position of a center of the first optical member are separated by a first distance.

19 Claims, 14 Drawing Sheets

(56) References Cited

FOREIGN PATENT DOCUMENTS

| | | | |
|---|---|---|---|
| JP | 2009540519 | A | 11/2009 |
| JP | 2010123458 | A | 6/2010 |
| JP | 2010160343 | A | 7/2010 |
| JP | 2010192189 | A | 9/2010 |
| JP | 2010272858 | A | 12/2010 |
| JP | 2011118330 | A | 6/2011 |
| JP | 5125935 | B2 * | 1/2013 |
| JP | 2013114772 | A | 6/2013 |
| JP | 2013251173 | A | 12/2013 |
| JP | 2015-187635 | A | 10/2015 |
| JP | 2016118675 | A | 6/2016 |
| JP | 2016186949 | A | 10/2016 |
| JP | 2017079243 | A | 4/2017 |
| JP | 2017-181831 | A | 10/2017 |
| WO | 2019159641 | A1 | 8/2019 |

\* cited by examiner

DISPLAY DEVICE AND DISPLAY SYSTEM

CROSS-REFERENCE TO RELATED APPLICATION

This application is a Continuation of U.S. application Ser. No. 16/925,119, filed Jul. 9, 2020, which claims priority from Japanese Patent Application No. 2019-130386, filed on Jul. 12, 2019, which is hereby incorporated by reference herein in its entirety.

BACKGROUND OF THE INVENTION

Field of the Invention

The present disclosure relates to a display device and a display system.

Description of the Related Art

There is an increasing need for wearable display devices such as AR, VR, and MR devices. The wearable display devices have a problem in that the size and the weight need to be decreased.

In Japanese Patent Laid-Open No. 2018-106167 (hereinafter, PTL 1), a display device that can be used as a wearable display device is proposed. FIG. 14 illustrates the display system disclosed in PTL 1. In FIG. 14, the display system includes a display device 2200. Light that is emitted from the display device 2200 passes through an ocular optical system 2100 and is directly guided to the pupils of a user. The ocular optical system 2100 includes a first lens group 2110 and a second lens group 2120. The use of the display system disclosed in PTL 1 allegedly enables a small, lightweight display system having a maximum angle of view of more than 80 degrees to be provided.

Regarding the display system in PTL 1, however, the display device is not sufficiently considered.

SUMMARY OF THE INVENTION

According to an aspect of the embodiments a display device including a display region in which a plurality of pixels are arranged two-dimensionally is provided. Each of the plurality of pixels includes a light-emitting layer and an optical member that refracts light from the light-emitting layer. In an orthographic projection of a first optical member included in a first pixel with respect to the light-emitting layer, a position of an apex of the first optical member and a position of a center of the first optical member are separated by a first distance.

Further features of the present disclosure will become apparent from the following description of exemplary embodiments with reference to the attached drawings.

DESCRIPTION OF THE EMBODIMENTS

Embodiments will hereinafter be described in detail with reference to the accompanying drawings. The embodiments described below do not limit the invention according to claims. According to the embodiments, features will be described. However, not all of the features are essential for the invention, and the features may be freely combined. In the accompanying drawings, components like or similar to each other are designated by like reference numbers, and a duplicated description is omitted.

Figure 14:
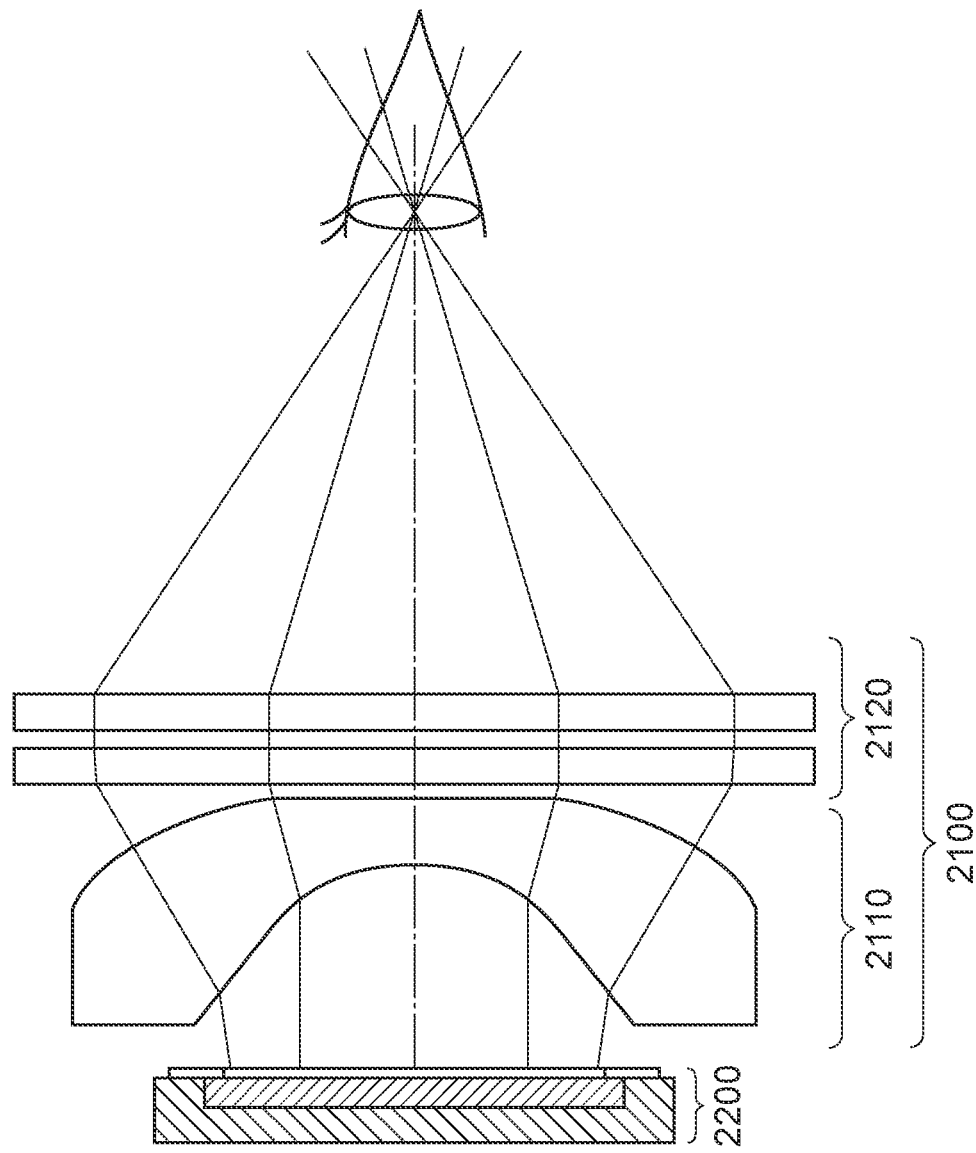
FIG. 14 illustrates an optical system.

As illustrated in FIG. 14, an optical lens system (ocular optical system) 2100 is disposed between a display device and the eyes of a user. Regarding a central portion of a display region of the display device, the optical lens system uses luminous flux that is emitted in a direction perpendicular thereto as light that is to be viewed by the eyes of the user. As a position is closer to a peripheral portion of the display region, luminous flux that is emitted in a direction inclined at an increased angle of elevation is used as the light that is to be viewed by the eyes of the user. Accordingly, as the position is closer to the peripheral portion away from the central portion of the display region, the luminous flux that is emitted in the perpendicular direction is more likely to be useless and is more unlikely to be used. The useless luminous flux that is not used becomes an unintentional reflection component in the optical lens system and can result in degradation in display quality such as a ghost and color mixing.

The present inventors have arrived at such an idea and have conceived a solution as follows: regarding optical members of a display device, the structure of a first optical member that is disposed at a central portion of a display region is differentiated from the structure of a second optical member that is disposed at a peripheral portion of the display region. The embodiments for carrying out the present disclosure will be described below with reference to the drawings. In the description below and the drawings, common components in the drawings are designated by common reference characters. Accordingly, the drawings are mutually referred to describe the common components, and a description of a component that is designated by a common reference character is appropriately omitted.

First Embodiment

Description of Display Device

Figure 1:
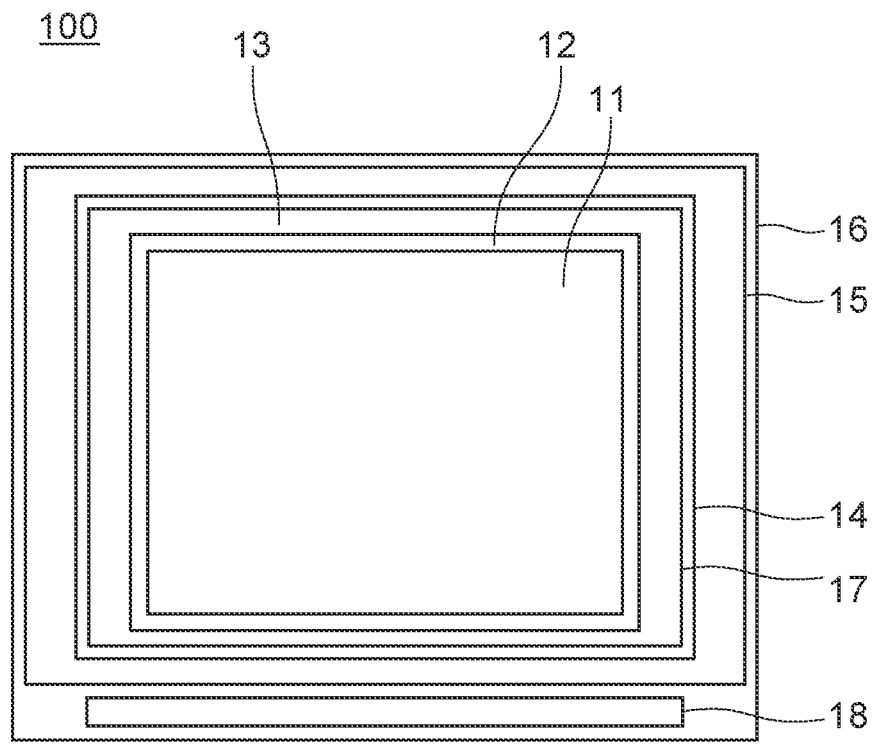
FIG. 1 schematically illustrates a display device.

FIG. 1 illustrates a plan view of a display device 100. In the plan view, arrangement is illustrated when the display device 100 is viewed in a direction perpendicular to a main surface of a semiconductor substrate 16 (direction of a normal to the main surface). In the plan view, overlapping members can be seen through.

The display device 100 has an effective pixel region 11 in which effective pixels are provided and a periphery circuit region 13 that is located around the effective pixel region 11.

The effective pixel region 11 is quadrilateral. In the periphery circuit region 13, periphery circuits are disposed. The periphery circuits of the display device include a drive circuit that drives the effective pixels and a processing circuit, such as a DAC (digital-to-analog conversion circuit) that processes signals that are inputted into the effective pixels.

A non-effective pixel region 12 in which non-effective pixels are provided is located between the periphery circuit region 13 and the effective pixel region 11. Examples of the non-effective pixels include a dummy pixel, a reference pixel, a test pixel, and a monitor pixel that do not function as an effective pixel.

Each pixel that is provided in the effective pixel region 11 includes a light-emitting layer (not illustrated) and an optical member (not illustrated) that is transparent to light from the light-emitting layer. An example of the optical member is a microlens. A color filter (not illustrated) may be disposed between the light-emitting layer and the optical member. Microlenses each of which serves as the optical member may be continuously disposed not only in the effective pixel region 11 but also in the non-effective pixel region 12. The microlenses may be continuously disposed not only in the non-effective pixel region 12 but also in the periphery circuit region 13. There is a possibility that a step is formed along the boundary between a region in which the microlenses are disposed and a region in which no microlenses are disposed. Accordingly, the microlenses are continuously disposed up to the periphery circuit region 13. In an example in FIG. 1, the microlenses are disposed in the effective pixel region 11, the non-effective pixel region 12, and the periphery circuit region 13. The outer edge of the region in which the microlenses are disposed is designated by the reference character 17 in FIG. 1. Also, in the case where the color filters are disposed, as illustrated in FIG. 1, color filters may be continuously disposed not only in the effective pixel region 11 but also in the non-effective pixel region 12 and the periphery circuit region 13. The outer edge of the region in which the color filters are disposed is designated by the reference character 14 in FIG. 1. A single unit of each microlens has a predetermined size. Each color filter can have a freely determined size. As illustrated in FIG. 1, the outer edge 14 of the region in which the color filters are disposed is located outside the outer edge 17 of the region in which the microlenses are disposed.

A transparent plate 15 illustrated in FIG. 1, for example, a glass substrate faces the effective pixel region 11, the non-effective pixel region 12, and the periphery circuit region 13 that are formed on the semiconductor substrate 16. The transparent plate 15 is joined to, for example, the effective pixel region 11 that is formed on the semiconductor substrate 16 by using a joint member. The joint member can include a matrix composed of resin and a filler that disperses in the matrix. The filler may be resin. In the case where a dicing process is performed simultaneously on the transparent plate 15 and the semiconductor substrate 16 in a manufacturing process, the outer edge of the transparent plate 15 and the outer edge of the semiconductor substrate 16 coincide with each other.

A connection region 18 illustrated in FIG. 1 is a connection region (pad) that is provided to connect an output signal from the display device 100 to an external device.

Arrangement of Pixels and Shapes of Optical Members

Figure 2A:
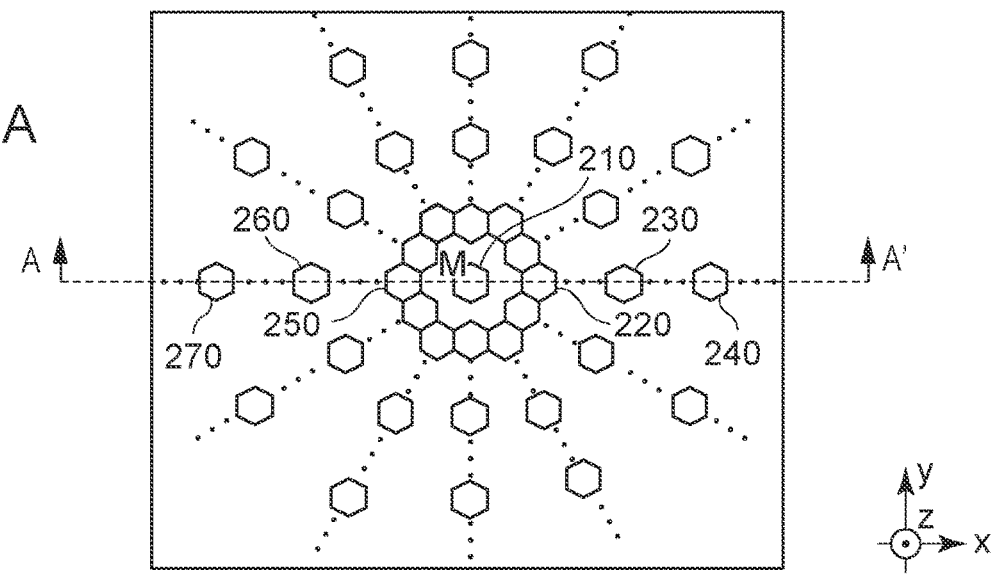
FIG. 2A to FIG. 2C illustrate the arrangement of pixels and microlenses according to a first embodiment.

FIG. 2A illustrates an example of two-dimensional arrangement of display pixels that are provided in the effective pixel region 11. The pixels are provided in delta arrangement of a honeycomb structure. In the case of a full color display device, a set is made by three pixels of an R-pixel (red-light-emitting pixel), a G-pixel (green-light-emitting pixel), and a B-pixel (blue-light-emitting pixel). In some cases, the pixels described according to the present embodiment are referred to as sub-pixels or secondary pixels.

A pixel 210 that is designated by the character M is located at the center of the effective pixel region 11. When viewed from the pixel 210, pixels 220, 230, and 240 are arranged in this order in a positive X-direction (right-hand side direction), and pixels 250, 260, and 270 are arranged in this order in a negative X-direction (left-hand side direction). One or more pixels are located between the pixels illustrated in the figure. However, the one or more pixels that are located between the pixels illustrated in FIG. 2A are omitted for convenience.

Figure 2B:
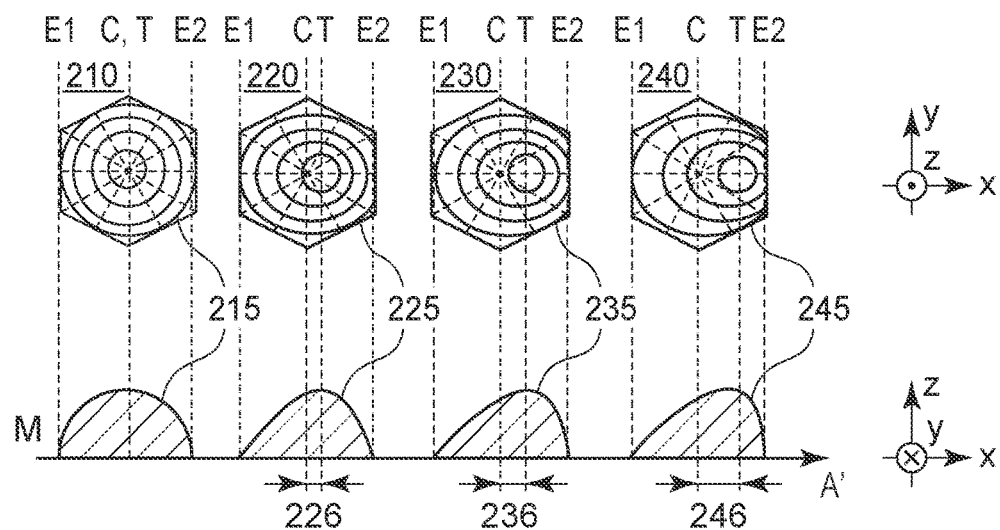
Figure 2C:
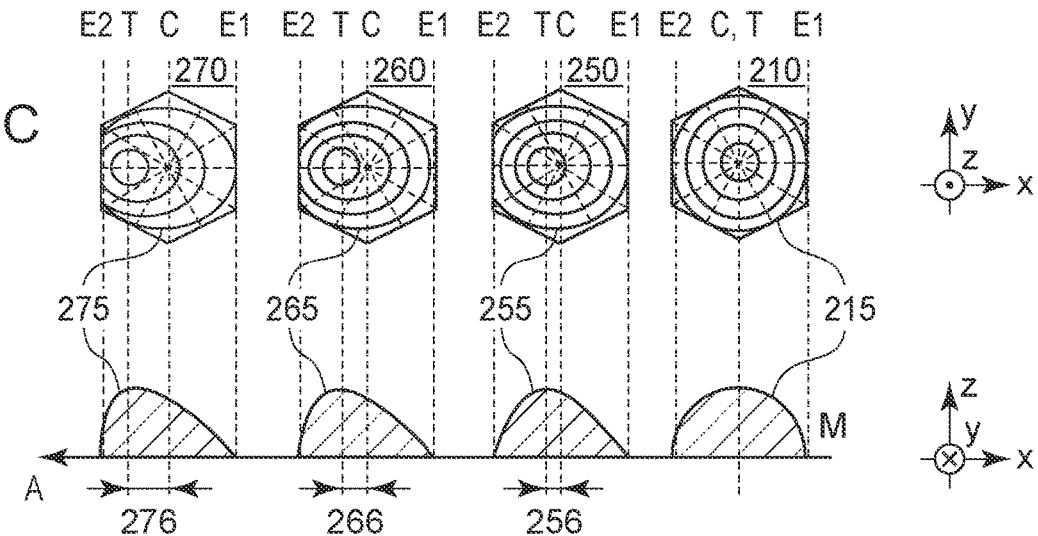

FIG. 2B and FIG. 2C illustrate a sectional view taken along line A-A' in FIG. 2A.

FIG. 2B illustrates the pixels 210, 220, 230, and 240 and microlenses 215, 225, 235, and 245 that are included in the respective pixels. FIG. 2C illustrates the pixels 210, 250, 260, and 270 and the microlens 215 and microlenses 255, 265, and 275 that are included in the respective pixels.

At upper parts in FIG. 2B and FIG. 2C, the relationships between the pixels and the microlenses on an XY plane are shown. The XY plane is a plane in an orthographic projection of each microlens that is the optical member on the light-emitting layer. In some cases, the orthographic projection is referred to as a plan view. For the microlenses, contour lines that connect positions at which heights in a Z-direction are equal to each other are illustrated.

At lower parts in FIG. 2B and FIG. 2C, the length of the each microlens in the X-direction and the height thereof in the Z-direction are illustrated.

E1 represents an end portion of each microlens facing the central portion. E2 represents an end portion of the microlens facing a peripheral portion. C represents the center of the microlens. T represents an apex of the microlens. The end portions of the microlens are located at positions at which the height in the Z-direction is the minimum height in the sectional view. The center of the microlens is the center of gravity of a shape that is formed by lines that connect the end portions of the microlens on the XY plane. The height of the microlens is the position of the highest portion in the Z-direction.

The center C and the apex T of the microlens 215 that is included in the pixel 210 (pixel M) coincide with each other on the XY plane. To coincide means to substantially coincide. A slight difference due to a manufacturing error is tolerated. The microlens 215 is a symmetrical microlens that has 2-fold rotational symmetry on the XY plane.

However, in the pixels 220 to 270 that are located nearer than the pixel 210 to the periphery, the microlenses 225, 235, 245, 255, 265, and 275 are arranged such that the center C and the apex T shift with respect to each other on the XY plane. The microlenses 225 to 275 are asymmetrical microlenses that do not have the 2-fold rotational symmetry on the XY plane. To be nearer to the periphery means to be nearer to an edge portion of the semiconductor substrate 16 when viewed from the central portion of the effective pixel region 11.

Regarding the microlens 225 that is included in the pixel 220 (first pixel), a distance 226 (first distance) in the positive X-direction (right-hand side direction) is equal to the distance between the center C and the apex T in the X-direction. Regarding the microlens 235 that is included in the pixel 230 (second pixel), a distance 236 (second distance) is equal to the distance between the center C and the apex T in the X-direction. Regarding the microlens 245 that is included in the pixel 240 (third pixel), a distance 246 (third distance) is equal to the distance between the center C and the apex T in the X-direction.

The distance 236 in the pixel 230 that is located nearer than the pixel 220 to the periphery is longer than the distance 226 in the pixel 220 that is located near the center of the effective pixel region. The distance 246 in the pixel 240 that is located nearer than the pixel 230 to the periphery is longer than the distance 236.

Similarly, regarding the microlens 255 that is included in the pixel 250 (fourth pixel), a distance 256 (fourth distance) in the negative X-direction (left-hand side direction) is equal to the distance between the center C and the apex T in the X-direction. Regarding the microlens 265 that is included in the pixel 260 (fifth pixel), a distance 266 (fifth distance) is equal to the distance between the center C and the apex T in the X-direction. Regarding the microlens 275 that is included in the pixel 270 (sixth pixel), a distance 276 (sixth distance) is equal to the distance between the center C and the apex T in the X-direction.

Also, in this case, the distance 266 in the pixel 260 that is located nearer than the pixel 250 to the periphery is longer than the distance 256 in the pixel 250 that is located near the center of the effective pixel region. The distance 276 in the pixel 270 that is located nearer than the pixel 260 to the periphery is longer than the distance 266.

Figure 3A:
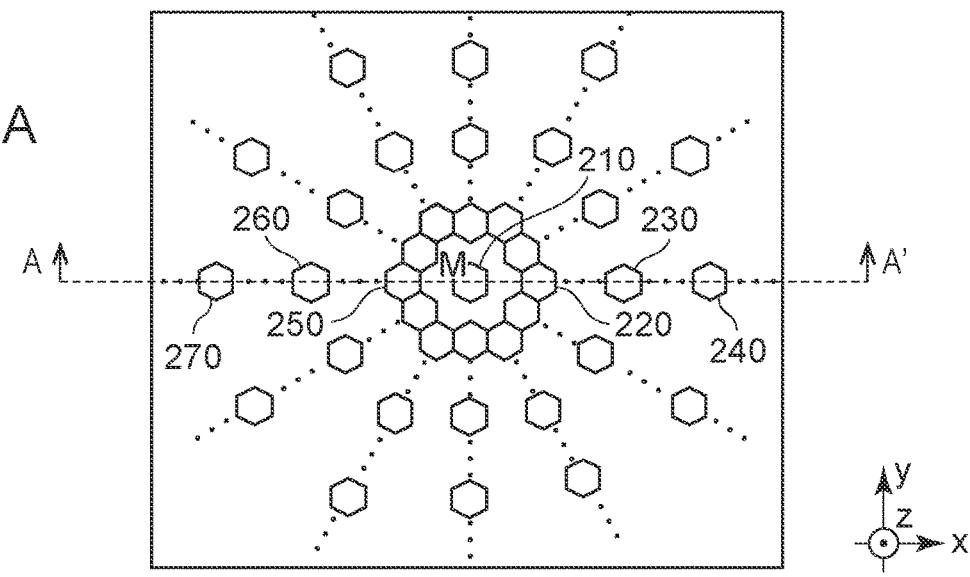
FIG. 3A to FIG. 3C illustrate the arrangement of the pixels and the microlenses according to the first embodiment.
Figure 3B:
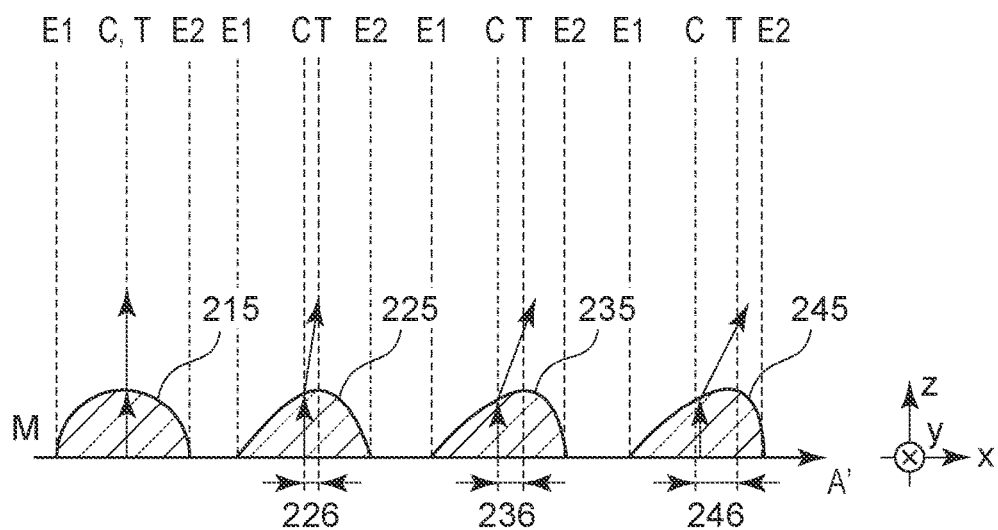
Figure 3C:
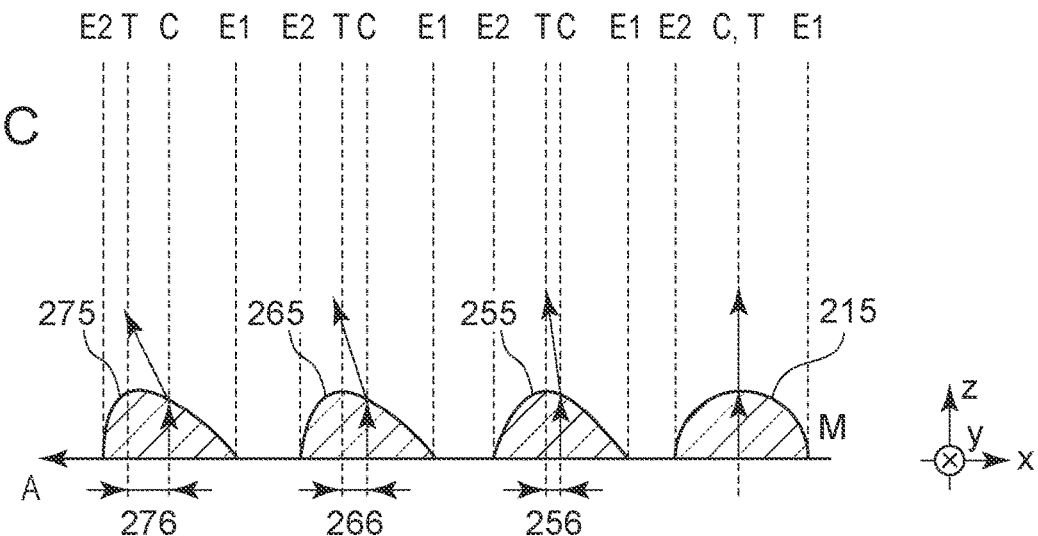

FIG. 3A to FIG. 3C illustrate the effects of the microlenses described with reference to FIG. 2A to FIG. 2C. As illustrated in FIG. 3B and FIG. 3C, as the position is closer to the periphery away from the central portion of the effective pixel region, an angle at which the luminous flux that is emitted from the light-emitting layer in the perpendicular direction is refracted by each microlens increases. That is, as the position is closer to the peripheral portion away from the central portion, refractive power (power) against the luminous flux that is emitted from the light-emitting layer in the perpendicular direction increases. For this reason, the radiation solid angle of the luminous flux that is emitted from the light-emitting layer can be concentrated within a solid angle that is used in the optical lens system, and the use efficiency of light can be improved. Luminous flux that is not used in the optical lens system can be reduced, and a ghost and color mixing can be inhibited from occurring due to an unintentional reflection component in the optical lens system. For this reason, a display device that is capable of improving the quality of display can be provided.

Figure 4A:
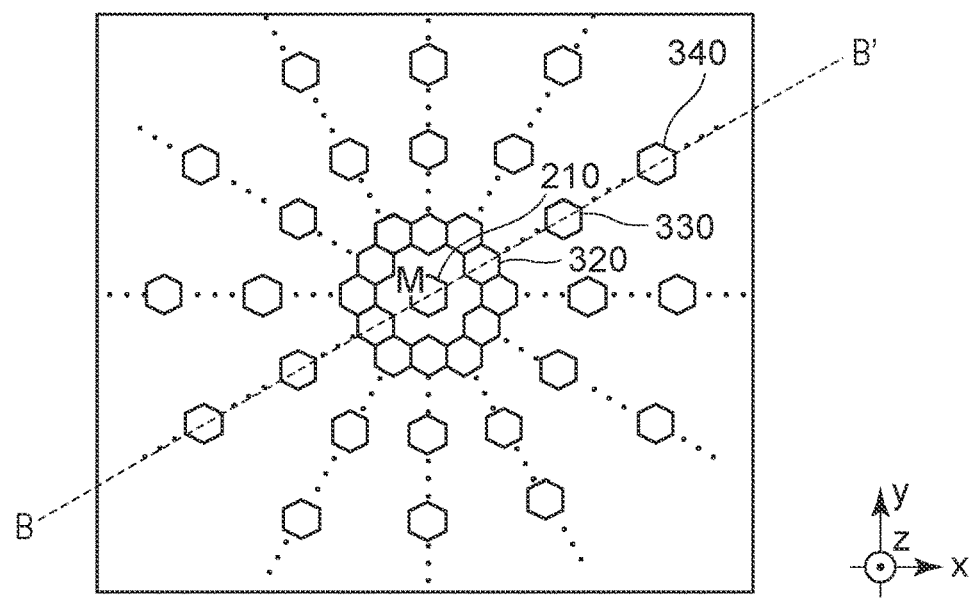
FIG. 4A and FIG. 4B illustrate the arrangement of the pixels and the microlenses according to the first embodiment.
Figure 4B:
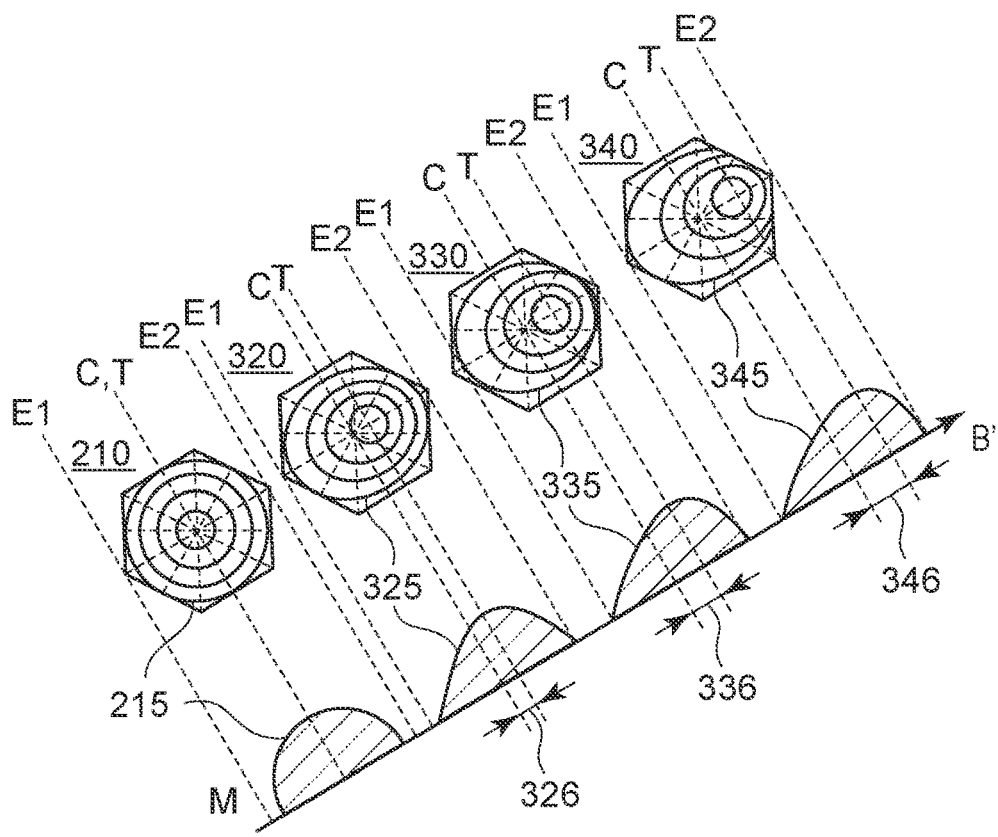

FIG. 4B illustrates a sectional view taken along line B-B' in FIG. 4A. The line B-B' extends in a direction (second direction) intersecting the X-direction (first direction) at a first angle.

As illustrated in FIG. 4A and FIG. 4B, pixels 320, 330, and 340 are arranged in a direction (B'-direction) from the pixel 210 toward the periphery. Microlenses 325, 335, and 345 are included in the respective pixels 320, 330, and 340. Regarding the distance between the center C and the apex T of each microlens on the XY plane, a distance 336 is longer than a distance 326, and a distance 346 is longer than the distance 336. That is, the angle at which the luminous flux that is emitted from the light-emitting layer in the perpendicular direction is refracted by each microlens increases as the position is closer to the periphery away from the central portion of the effective pixel region. This enables a display device that is capable of improving the quality of display to be provided.

In FIG. 4B, only the pixels that are arranged in the B'-direction including the pixel 210 are illustrated. However, pixels arranged in a B-direction including the pixel 210 include microlenses that are line-symmetrical to the microlenses illustrated in FIG. 4B. In this regard, the same is true for FIG. 5B and FIG. 6B described below.

Figure 5A:
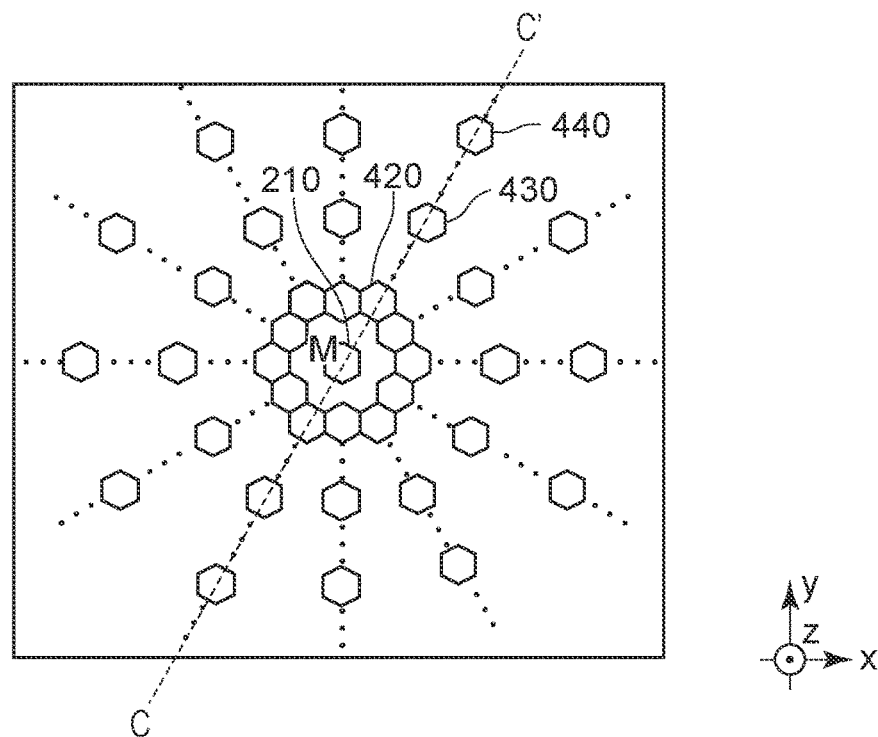
FIG. 5A and FIG. 5B illustrate the arrangement of the pixels and the microlenses according to the first embodiment.
Figure 5B:
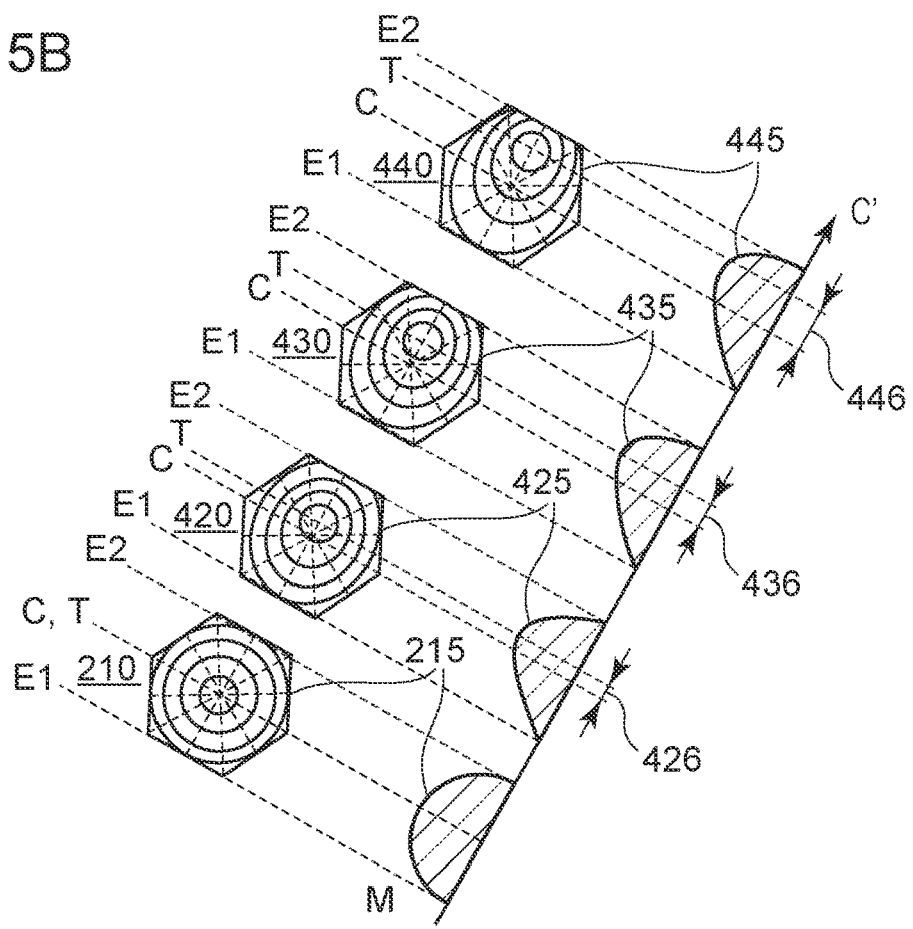

FIG. 5B illustrates a sectional view taken along line C-C' in FIG. 5A. The line C-C' extends in a direction (third direction) intersecting the X-direction (first direction) at a second angle.

As illustrated in FIG. 5A and FIG. 5B, pixels 420, 430, and 440 are arranged in a direction (C'-direction) from the pixel 210 toward the periphery. Microlenses 425, 435, and 445 are included in the respective pixels 420, 430, and 440. Regarding the distance between the center C and the apex T of each microlens on the XY plane, a distance 436 is longer than a distance 426, and a distance 446 is longer than the distance 436. That is, the angle at which the luminous flux that is emitted from the light-emitting layer in the perpendicular direction is refracted by each microlens increases as the position is closer to the periphery away from the central portion of the effective pixel region. This enables a display device that is capable of improving the quality of display to be provided.

Figure 6A:
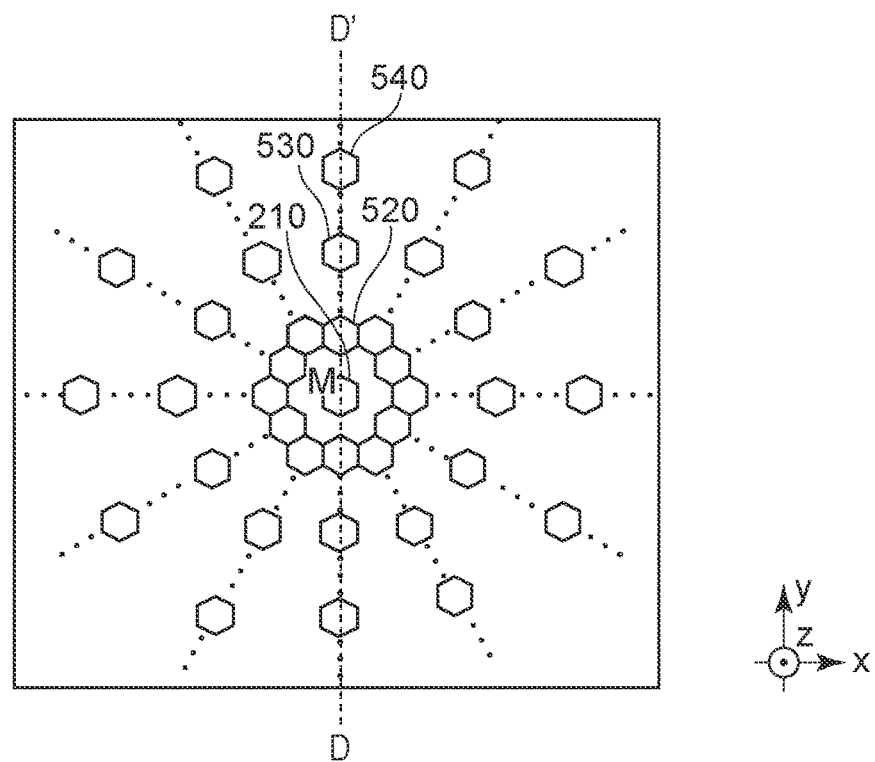
FIG. 6A and FIG. 6B illustrate the arrangement of the pixels and the microlenses according to the first embodiment.
Figure 6B:
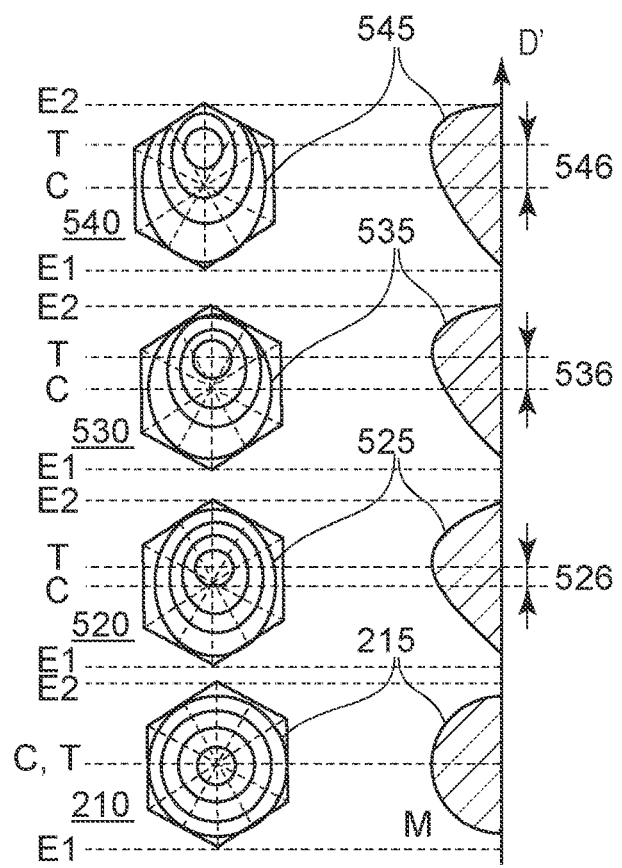
Figure 7A:
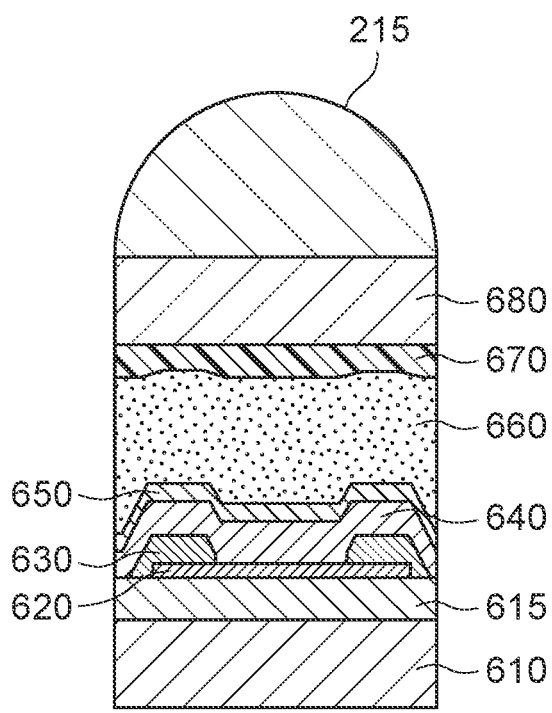
FIG. 7A to FIG. 7D illustrate pixel structures according to the first embodiment.
Figure 7B:
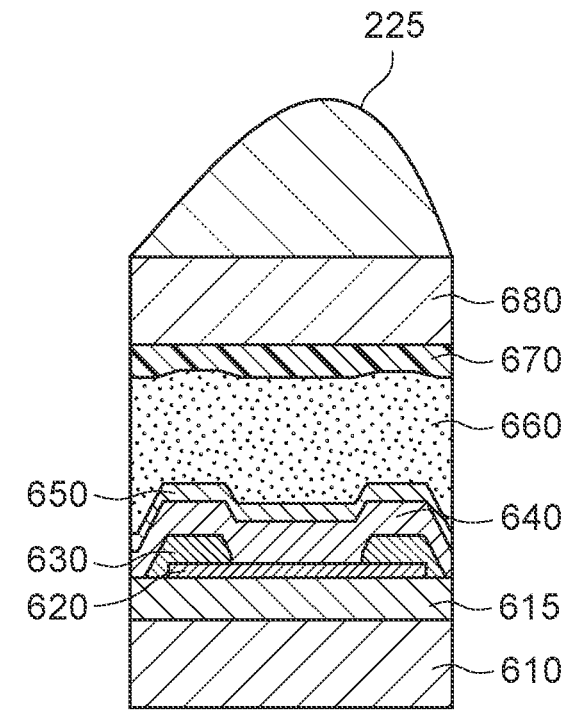
Figure 7C:
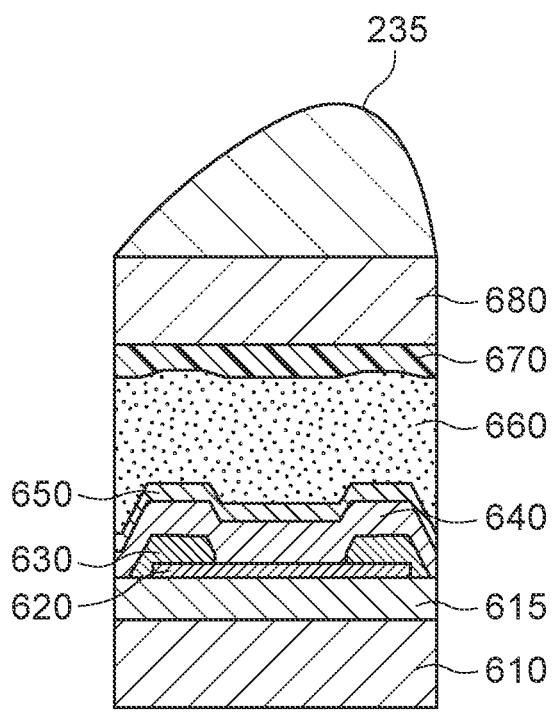
Figure 7D:
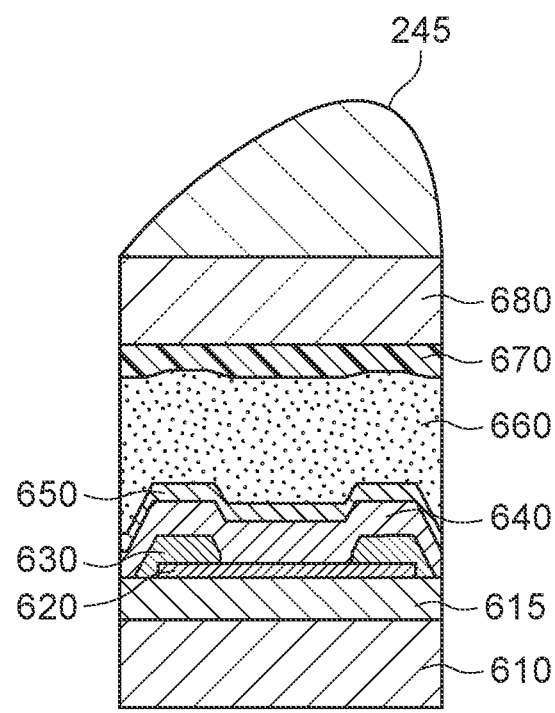

FIG. 6B illustrates a sectional view taken along line D-D' in FIG. 6A. The line D-D' extends in a direction (fourth direction) perpendicular to the X-direction (first direction).

As illustrated in FIG. 6A and FIG. 6B, pixels 520, 530, and 540 are arranged in a direction (D'-direction) from the pixel 210 toward the periphery. Microlenses 525, 535, and 545 are included in the respective pixels 520, 530, and 540. Regarding the distance between the center C and the apex T of each microlens on the XY plane, a distance 536 is longer than a distance 526, and a distance 546 is longer than the distance 536. That is, the angle at which the luminous flux that is emitted from the light-emitting layer in the perpendicular direction is refracted by each microlens increases as the position is closer to the periphery away from the central portion of the effective pixel region. This enables a display device that is capable of improving the quality of display to be provided.

Method of Forming Optical Members

The asymmetrical microlenses described above can be formed by light exposure and development processes. Specifically, a film (photoresist film) is formed by using a material for forming the microlenses, and the photoresist film is exposed to light and developed by using a mask that has continuous variations in gradation. Such a mask can be a gray mask or an area gradation mask that is manufactured by using a light-shielding film having a resolution equal to or less than the resolution of a light exposure device and that enables an imaging plane to be irradiated with light having continuous gradation by changing dot density distribution.

The shape of each microlens can be adjusted by performing an etch back process on the microlens that is formed by the light exposure and development processes.

The asymmetrical microlenses can be formed without performing the light exposure and development processes. For example, as disclosed in FIG. 5 in Japanese Patent Laid-Open No. 2016-118675, the asymmetrical microlenses can be formed by forming resin on small microlenses and reflowing the resin. In the case where an organic layer is used as the light-emitting layer, the temperature in a reflow process is set to a predetermined temperature or less. For example, the predetermined temperature or less means 120° C. or less.

Pixel Structure of Light-Emitting Element

FIG. 7A to FIG. 7D illustrate respective pixel structures of the pixels 210 to 240 illustrated in FIG. 2. FIG. 7A to FIG. 7D differ from each other in the shapes of the microlenses 215 to 245. The differences are described above. Common components in FIG. 7A to FIG. 7D will now be described.

In FIG. 7A to FIG. 7D, a wiring structure 615 is disposed on a silicon substrate 610, and a first electrode 620 is disposed on the wiring structure 615. A separation portion 630 (banks) is disposed between the first electrode 620 and a first electrode of the pixels adjacent to each other. An organic layer 640 as the light-emitting layer and a second electrode 650 are disposed above the first electrode 620. A sealing layer 660, a planarizing layer 670, and a color filter 680 are disposed above the second electrode 650.

The silicon substrate 610 includes a switching circuit such as a transistor.

The wiring structure 615 includes wiring layers of, for example, an aluminum layer and a copper layer, a via plug, and a contact plug. An insulating film that insulates wiring lines from each other is disposed between the wiring layers. The insulating film includes a silicon oxide layer, a silicon nitride layer, or a silicon carbide layer. A silicon oxynitride and a silicon carbonitride that contain nitrogen and silicon as main elements are kinds of a silicon nitride.

In one embodiment, the first electrode 620 is composed of a metal material that has a reflectance of 70% or more at a light-emitting wavelength. Metals such as Al and Ag, an alloy thereof that contains Si, Cu, Ni, or Nd, ITO, IZO, AZO, and IGZO can be used. The light-emitting wavelength described herein means a spectrum range of light that is emitted from the organic layer 640. The first electrode 620 may be a multilayer electrode including a barrier electrode composed of a metal such as Ti, W, Mo, or Au or an alloy thereof, provided that the reflectance is higher than a desired reflectance. A multilayer electrode including a transparent oxide film electrode such as an ITO or IZO electrode may be acceptable.

The first electrode 620 may be a transparent conductive film, and a reflection layer may be disposed on a lower portion of the first electrode 620. Examples of the transparent conductive film can include ITO, IZO, AZO, and IGZO films. As described according to an embodiment later, an optical adjustment layer may be disposed between the reflection layer and the transparent conductive film to optimize an optical distance. The optical film thickness of the optical adjustment layer differs among the R-pixel, the G-pixel, and the B-pixel. The optical adjustment layer is composed of, for example, a silicon nitride (SiN), a silicon oxynitride (SiON), or a silicon oxide (SiO).

The organic layer 640 can be formed by a known method such as a deposition method or a spin coating method. The organic layer 640 may include layers. Examples of the layers include a hole injection layer, a hole transport layer, an electron-blocking layer, a light-emitting layer, a hole-blocking layer, an electron transport layer, and an electron injection layer. The organic layer 640 emits light when holes that are injected from an anode and electrons that are injected from a cathode are recombined in the organic layer. The organic layer may have a single layer structure or a multi-layer structure. The organic layer can contain a red-light-emitting material, a green-light-emitting material, or a blue-light-emitting material at any position. The white color can be obtained by mixing light-emitting colors.

The second electrode 650 is disposed on the organic layer 640 and has transparency. The second electrode 650 may be composed of a semi-transparent material that has properties allowing a part of light from the organic layer 640 to pass therethrough and another part of the light to be reflected (that is, semi-transparent, semi-reflective properties). Examples of the material of the second electrode 650 include transparent materials (ITO and IZO) such as transparent conductive oxides, metals such as aluminum, silver, and gold, alkali metals such as lithium and cesium, alkaline earth metals such as magnesium, calcium, and barium, and a semi-transparent material consisting of an alloy material that contains these metal materials. In particular, in one embodiment, the semi-transparent material contains magnesium or silver as a main component. The second electrode 650 may have a multilayer structure composed of any one of the above materials, provided that the material has transmittance. The second electrode 650 may be integrally formed with the pixels and may be shared.

In one embodiment, the sealing layer 660 contains an inorganic material that has translucency and that is less transparent to oxygen and water from the outside. In particular, inorganic materials such as a silicon nitride (SiN), a silicon oxynitride (SiON), a silicon oxide (SiOx), an aluminum oxide ($Al_2O_3$), and a titanium oxide ($TiO_2$) are used. SiN, SiON, and $Al_2O_3$ inorganic materials are used particularly in the perspective of sealing performance. The sealing layer 660 is formed by using a chemical vapor deposition method (CVD method), an atomic layer deposition method (ALD method), or a spattering method. The sealing layer 660 may have a single layer structure or a multilayer structure that is obtained by a combination of the above materials and a formation method, provided that the sealing layer has sufficient water-shielding performance. A display device according to an embodiment of the present disclosure can inhibit color mixing due to stray light toward an aspherical microlens of an adjacent pixel from occurring more effectively as the distances between the organic layer 640 and the microlenses 215 to 245 decrease. Accordingly, a sealing film composed of, for example, aluminum oxide ($Al_2O_3$) that is formed by the atomic layer deposition method (ALD method) and that has excellent coverage performance even when being thin is used.

The planarizing layer 670 can include a resin layer that has translucency. For example, the planarizing layer can be formed by using a spin coating method.

The color filter 680 is transparent to different colors. An example thereof is a color filter that is transparent to red light, green light, and blue light. A color filter that is transparent to cyan light, magenta light, and yellow light is also acceptable.

In FIG. 7A to FIG. 7D, for example, the color filter 680 is transparent to green light. A part of the color filter or the entire color filter may be omitted.

In FIG. 1, the color filters that are patterned in red, green, and blue are disposed in the effective pixel region 11 and the non-effective pixel region 12. The periphery circuit region 13 may include a region in which only a monochromatic color filter is disposed. For example, in FIG. 1, a 100 μm or more region extending from the outer edge 14 of the region in which the color filters are disposed may be a region in which only a color filter that is transparent to blue light is disposed.

RGB-Pixel Structure

Figure 8A:
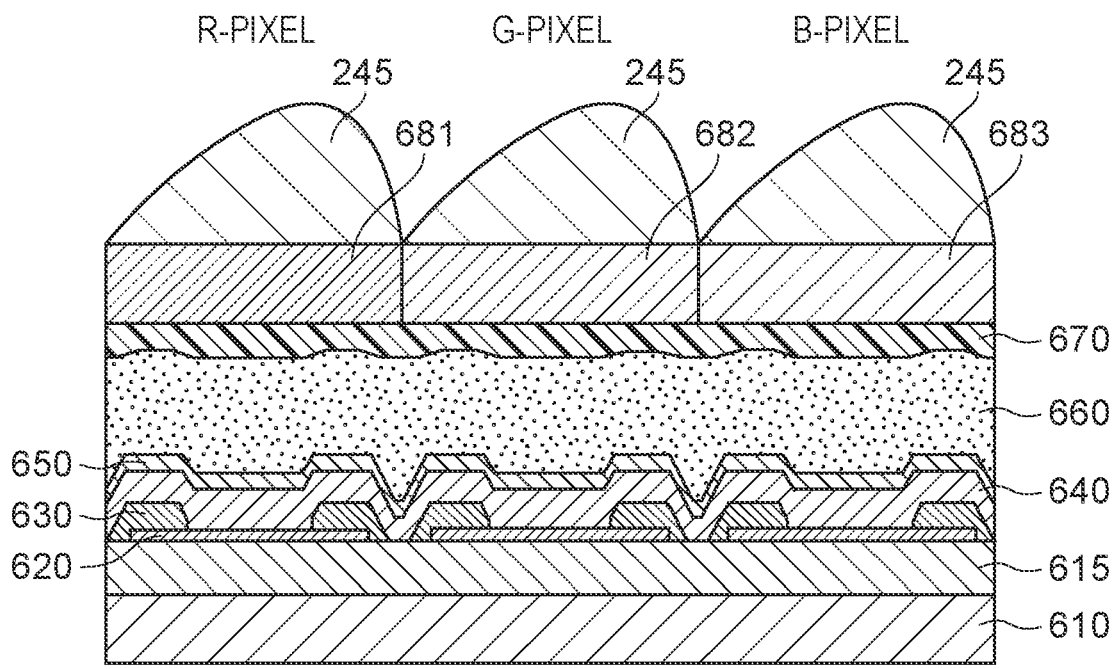
FIG. 8A and FIG. 8B illustrate pixel structures according to the first embodiment.

FIG. 8A illustrates the structure of a light-emitting element that includes an R-pixel, a G-pixel, and a B-pixel. The R-pixel includes a color filter 681 that is selectively transparent to red. The G-pixel includes a color filter 682 that is selectively transparent to green. The B-pixel includes a color filter 683 that is selectively transparent to blue.

The RGB-pixels adjacent to each other include respective microlenses 245 that have a shape common to each other. That is, asymmetrical microlenses that are included in the pixels adjacent to each other do not necessarily have different shapes. For example, the effective pixel region is divided into three or more blocks, which are referred to as a first block, a second block, and a third block in this order in a direction from the central portion of the effective pixel region toward the periphery. In this case, a pixel that belongs to the first block may include the microlens 215, a pixel that belongs to the second block may include the microlens 225, and a pixel that belongs to the third block may include the microlens 235. The microlenses that are included in the pixels adjacent to each other in the second block and the third block have the same shape. To be the same described herein means to be substantially the same, and a design error is tolerated.

Regarding a pixel that is provided between the pixel 220 and the pixel 230 illustrated in FIG. 2A, an asymmetrical microlens that has a distance that falls between the distance 226 of the microlens 225 and the distance 236 of the microlens 235 may be provided. In this case, the asymmetrical microlenses that are included in the pixels adjacent to each other have different shapes.

In FIG. 8A, the centers of the microlenses 245 coincide with the centers of the respective pixels. However, the centers of the microlenses 245 may shift toward the periphery of the effective pixel region away from the centers of the respective pixels. The distance at which the centers of the microlens 245 shift may be gradually increased as the positions of the pixels are closer to the periphery away from the center of the effective pixel region.

Characteristics of Microlenses According to Present Embodiment

The angle at which the luminous flux that is emitted from the light-emitting layer in the perpendicular direction is refracted by each microlens increases as the position is closer to the periphery away from the central portion of the effective pixel region. For this purpose, an asymmetrical microlens illustrated in FIG. 2 in Japanese Patent Laid-Open No. 2007-335723 may be used. The asymmetrical microlens is called a teardrop microlens.

Each microlens illustrated in FIG. 2A to FIG. 6B in the present disclosure corresponds to a microlens illustrated in FIG. 3(a) in Japanese Patent Laid-Open No. 2015-012488.

Each microlens illustrated in FIG. 2A to FIG. 6B in the present disclosure occupies a pixel area larger than that of the teardrop microlens and enables light to be more efficiently focused. Specifically, as illustrated, for example, on the XY plane at the upper part in FIG. 2B, the outer edges of the microlenses 225, 235, and 245 include sides extending in the Y-direction on the XY plane. That is, the outer edges of the microlenses include the sides extending in the second direction (Y-direction) intersecting the first direction (X-direction) in which the microlenses are arranged. However, the teardrop microlens does not have a side extending in the Y-direction. Consequently, the pixel area that is occupied by the teardrop microlens is smaller than the area that is occupied by each microlens illustrated in FIG. 2A to FIG. 6B in the present disclosure. The relationship of the magnitude of the occupied area can be understood by comparing FIG. 4(a) and FIG. 4(b) in Japanese Patent Laid-Open No. 2015-012488.

Japanese Patent Laid-Open No. 2007-335723 and Japanese Patent Laid-Open No. 2015-012488 disclose microlenses that are used for an imaging apparatus and different use from the use of the microlenses for the display device according to the present embodiment.

Modification to Present Embodiment

Figure 8B:
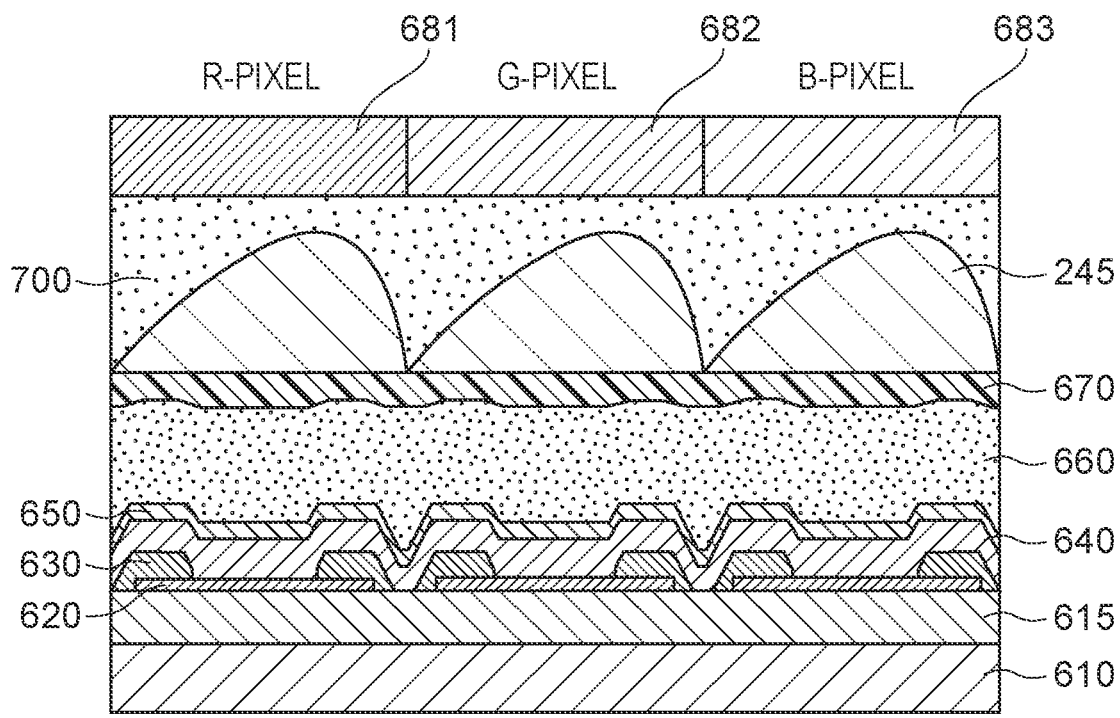

FIG. 8B differs from FIG. 8A in that the color filters 681 to 683 are disposed above the microlenses 245. A layer 700 is disposed between the microlenses 245 and the color filters 681 to 683. The layer 700 may be composed of resin to function as a planarizing layer and function as an adhesive that causes the color filters 681 to 683 and the microlenses 245 to adhere to each other. In this case, the resin may have a single layer, or a resin layer for the planarizing layer and a resin layer for the adhesive may be functionally separated from each other and may be separated layers. The layer 700 may be an air gap layer (gas layer). In the case where the layer 700 is an air gap layer, the difference in refractive indices between the microlenses 245 and the layer 700 can be ensured. Accordingly, the refractive power (power) of the microlenses 245 can be increased, and a display device that is capable of improving the quality of display can be provided.

Figure 9A:
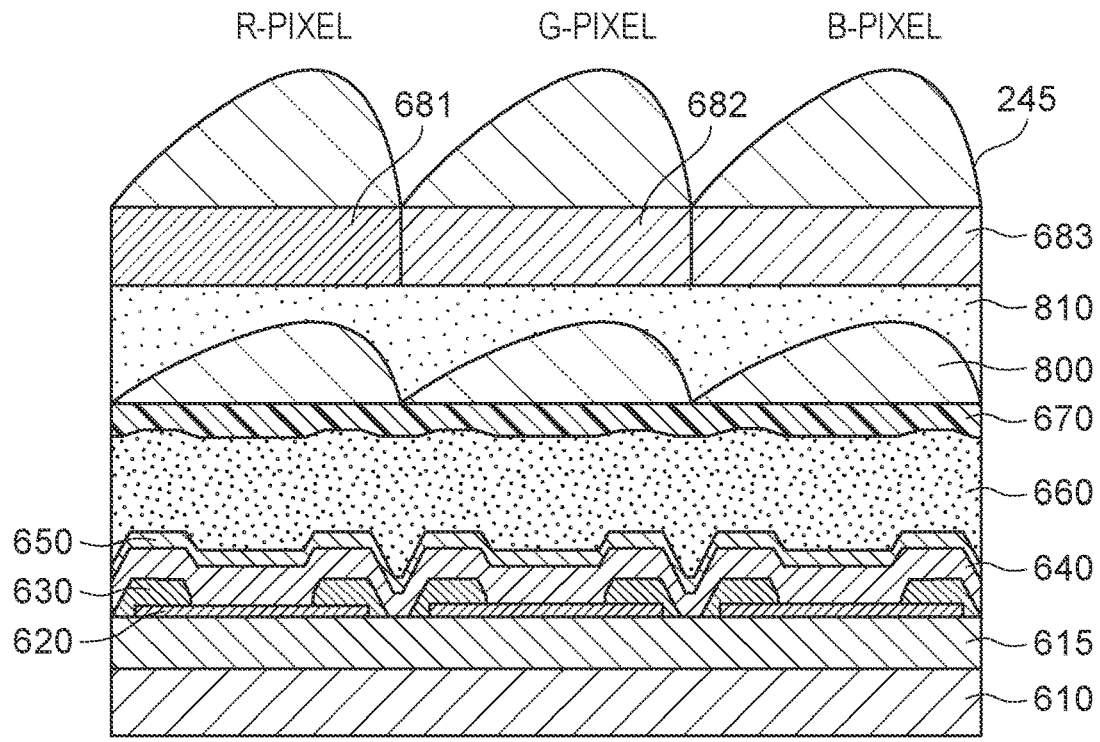
FIG. 9A and FIG. 9B illustrate pixel structures according to the first embodiment.

FIG. 9A differs from FIG. 8A in that other microlenses 800 are disposed between the microlenses 245 and the organic layer 640. In the case where the luminous flux cannot be sufficiently refracted by only the microlenses 245, the microlenses 800 are additionally provided. This enables a display device that is capable of improving the quality of display to be provided. A layer 810 may be a resin layer or an air gap layer as in the layer 700. In an example illustrated in FIG. 9A, the microlenses 800 are asymmetrical microlenses but may be symmetrical microlenses, and the centers of the microlenses may shift toward the periphery of the effective pixel region away from the centers of the pixels. The asymmetrical microlenses each of which has the shifting center may be used.

Figure 9B:
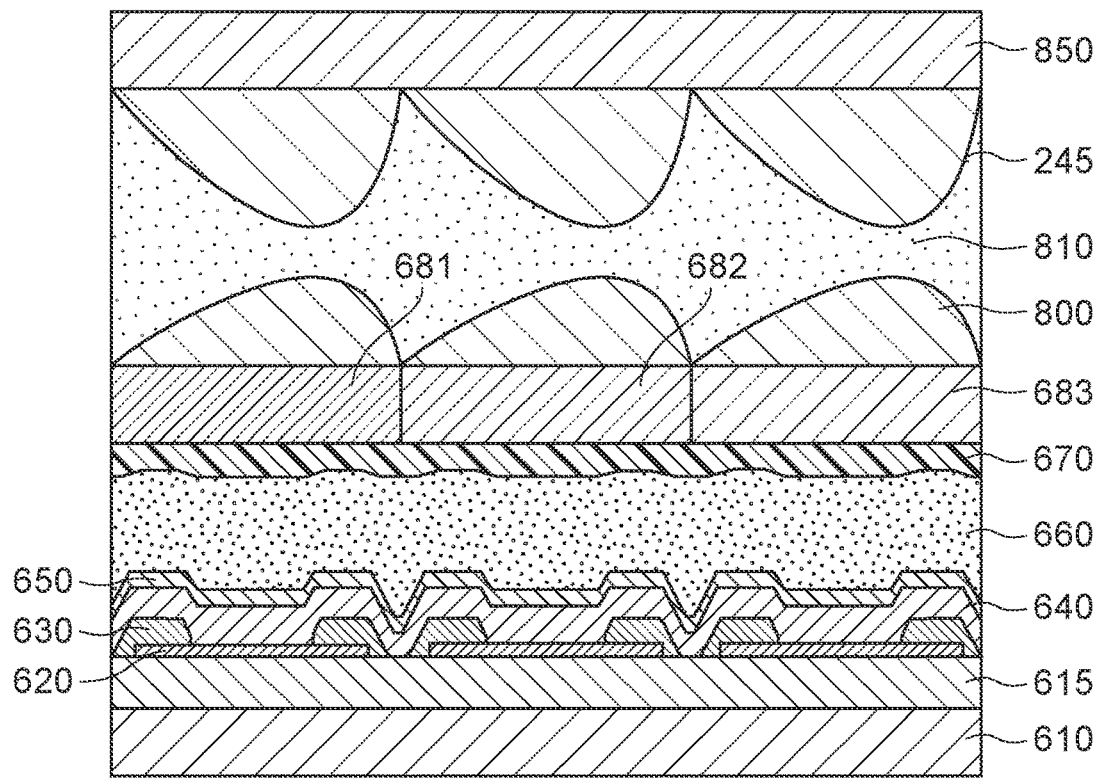

FIG. 9B differs from FIG. 9A in that the microlenses 245 have a convex shape toward the organic layer 640 that is the light-emitting layer. The refractive index of the resin layer 810 is smaller than the refractive indices of the microlenses 800 and the microlenses 245. This enables the luminous flux that is emitted from the light-emitting layer in the perpendicular direction to be refracted in the same direction by using the microlenses 800 and the microlenses 245. With this structure, the microlenses 245 have a convex shape toward the light-emitting layer.

Figure 10A:
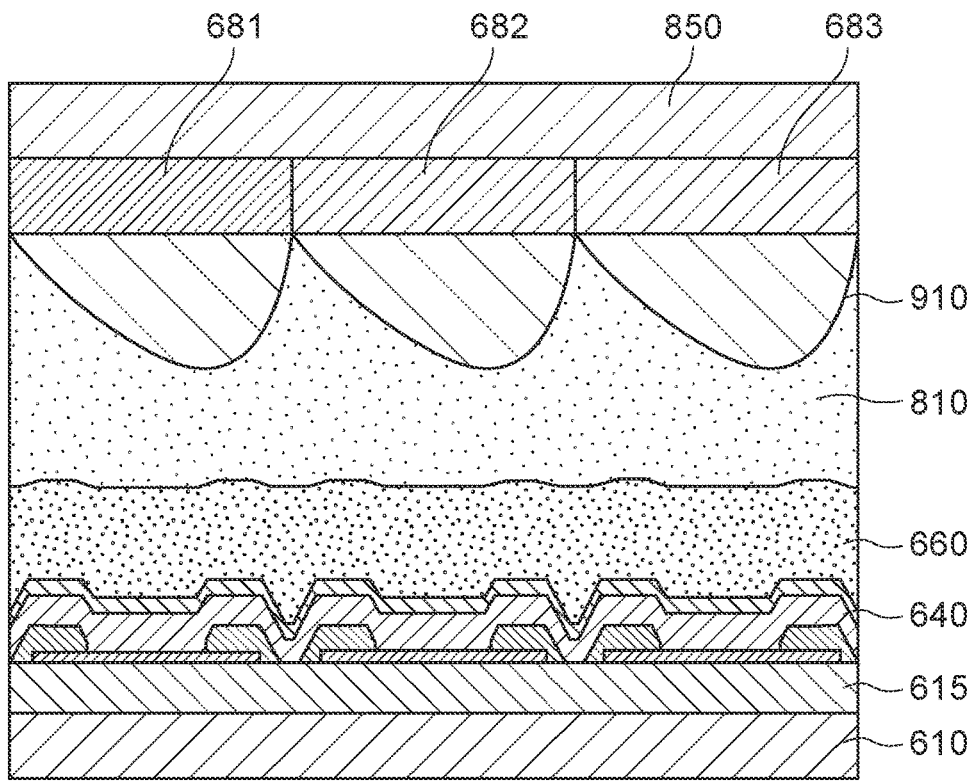
FIG. 10A and FIG. 10B illustrate pixel structures according to the first embodiment.

FIG. 10A differs from FIG. 8A in that microlenses 910 and the color filters 681 to 683 are secured to a substrate 850 that differs from the silicon substrate 610. Components from the wiring structure 615 to the sealing layer 660 are formed above the silicon substrate 610 into a first chip. The microlenses 910 and the color filters 681 to 683 are formed below the substrate 850 into a second chip. The first chip and the second chip are bonded so as to face each other. The layer 810 may be a resin layer or an air gap layer as described above. It suffices that the substrate 850 is a transparent substrate, and an example thereof is a glass substrate.

Figure 10B:
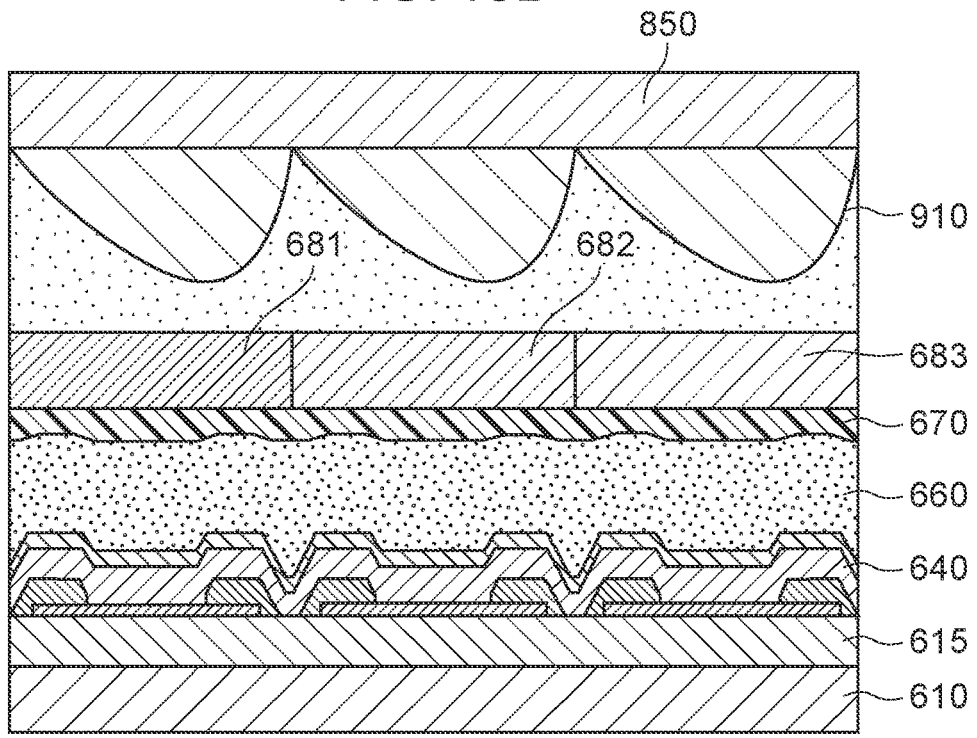

FIG. 10B illustrates a modification to FIG. 10A. For example, components from the wiring structure 615 to the color filters 681 to 683 are formed above the silicon substrate 610 into a first chip. Microlenses are formed on the substrate 850 into a second chip. The first chip and the second chip are bonded so as to face each other.

Second Embodiment

Figure 11:
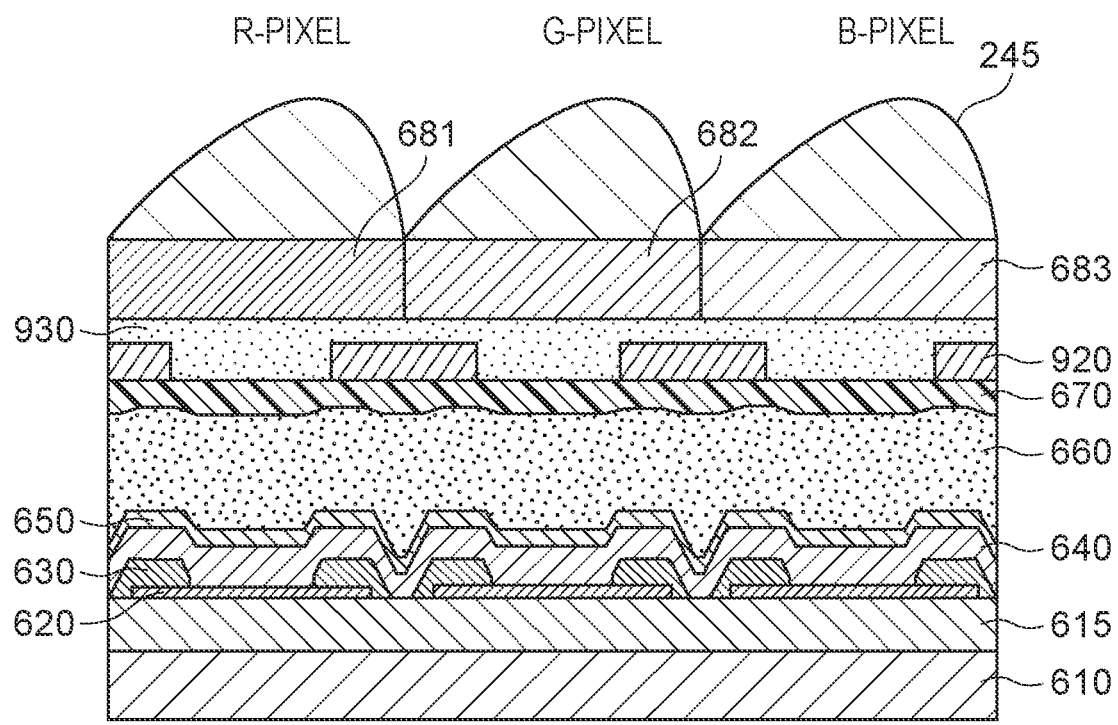
FIG. 11 illustrates a pixel structure according to a second embodiment.

A second embodiment differs from the first embodiment in FIG. 8A in that a light-shielding layer is provided. In FIG. 11, a light-shielding layer 920 is disposed on the planarizing layer 670, and another planarizing layer 930 is disposed on the light-shielding layer 920. The light-shielding layer 920 is formed between the pixels adjacent to each other. The light-shielding layer 920 enables color mixing of the pixels adjacent to each other to be inhibited. It suffices that the light-shielding layer 920 absorbs a wavelength component of a visible region of light that is emitted from the organic layer 640 that is the light-emitting layer. For example, as in the color filter, pigment or carbon black can be dispersed in photosensitive resin. The light-shielding layer 920 may be a light-shielding layer that is obtained by stacking two or more kinds of color filters. The light-shielding layer 920 may be arranged so as to entirely cover the pixels or so as to partly cover the pixels. The light-shielding layer 920 does not need to completely shield light having a wavelength in the visible region, provided that 80% or more, or 90% or more of the light is shielded.

A reflective structure may be disposed between the pixels adjacent to each other instead of the light-shielding layer 920. Also, with this structure, light is inhibited from entering the microlenses that are disposed in the pixels adjacent to each other, and color mixing of the pixels adjacent to each other can be inhibited.

Third Embodiment

A third embodiment differs from the first embodiment in FIG. 8A in that optical adjustment layers are disposed below the organic layer, and reflection layers are disposed below the optical adjustment layers.

Figure 12:
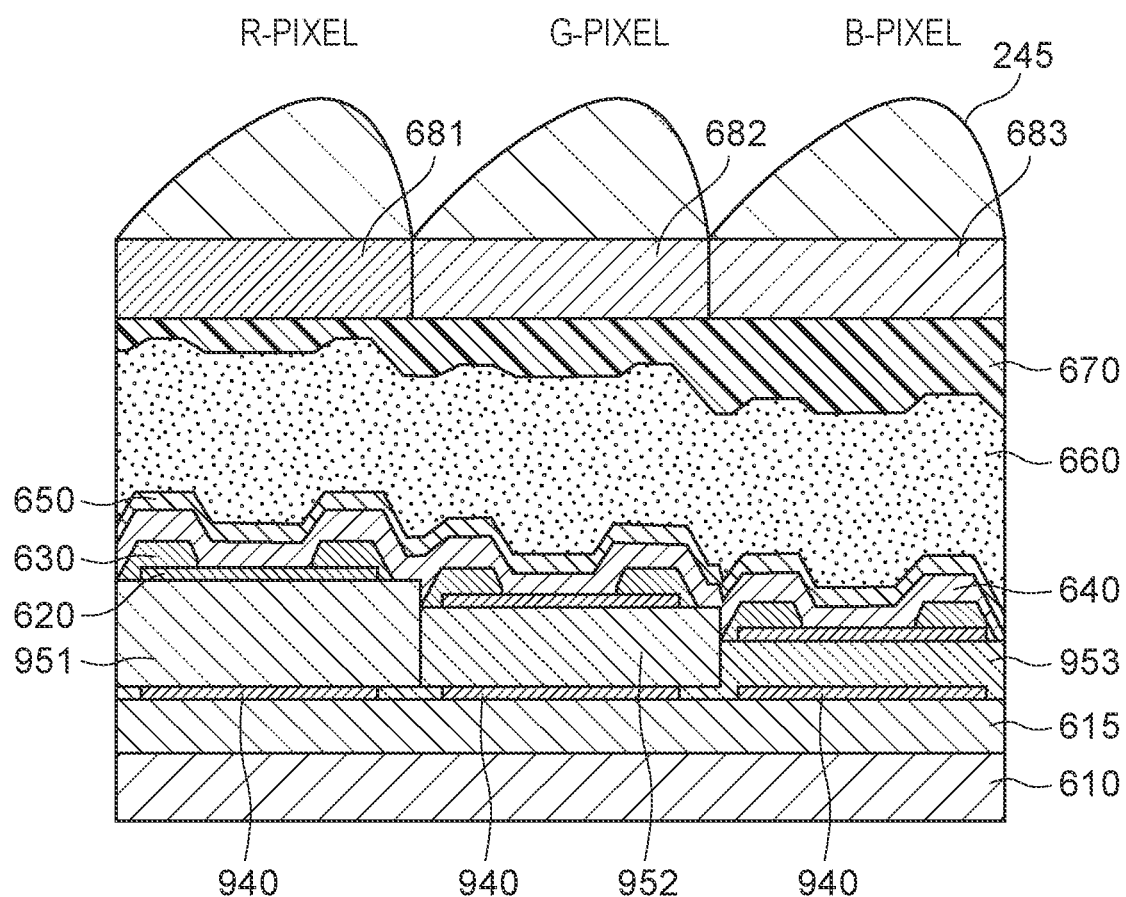
FIG. 12 illustrates a pixel structure according to a third embodiment.

In FIG. 12, the R-pixel includes an optical adjustment layer 951, the G-pixel includes an optical adjustment layer 952, and the B-pixel includes an optical adjustment layer 953. Reflection layers 940 are disposed below the optical adjustment layers. The optical adjustment layers 951 to 953 have optimized optical film thicknesses depending on the wavelengths of the respective pixels. The directivity of light that is emitted from the RGB-pixels can be increased due to optical interference. Consequently, stray light toward a spherical microlens that is disposed between the pixels adjacent to each other can be inhibited. For this reason, useless luminous energy is eliminated, the use efficiency of light is improved, and color mixing due to stray light can be inhibited. The selectivity of the wavelength for every pixel is improved due to the optical interference, and the film thickness of each color filter can be decreased. For this reason, the distance between the organic layer and each microlens can be decreased, and stray light is inhibited from entering each microlens between the pixels adjacent to each other.

Fourth Embodiment

Application of the display devices according to the embodiments described above will be described with reference to FIG. 13A and FIG. 13B. Each display device can be used for a system that is capable of being worn as a wearable device such as smart glasses, a HMD, and a smart contact lens. An imaging display device that is used as an example of the application includes an imaging device that can carry out photoelectric conversion of the visible light and a display device that can emit the visible light.

Figure 13A:
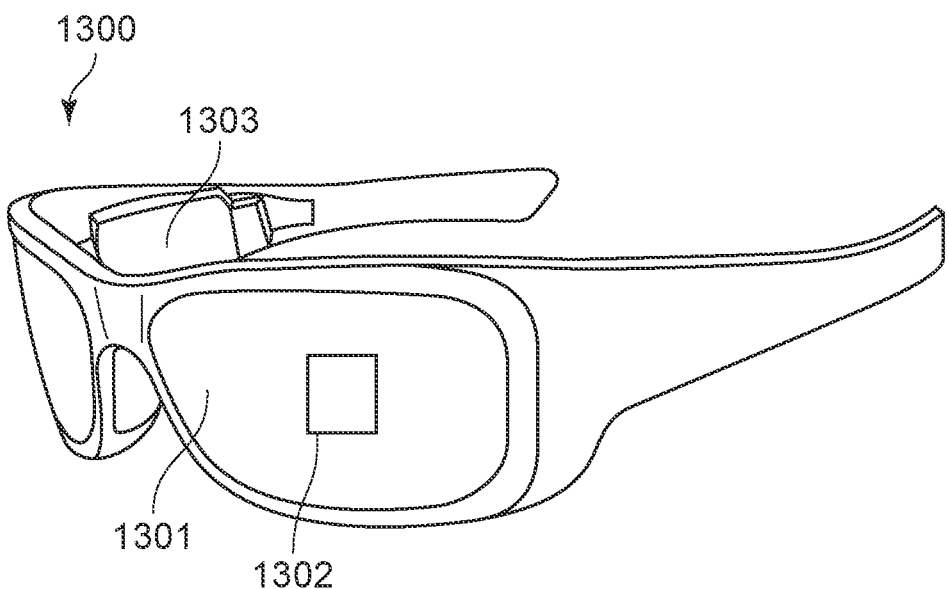
FIG. 13A and FIG. 13B illustrate display device systems according to a fourth embodiment.

FIG. 13A illustrates glasses 1300 (smart glasses) that are used as an example of the application. An imaging device 1302 such as a CMOS sensor or a SPAD is disposed on a front surface of a lens 1301 of the glasses 1300. The display device according to one of the embodiments is disposed on a back surface of the lens 1301.

The glasses 1300 also include a control device 1303. The control device 1303 functions as a power supply that supplies power to the imaging device 1302 and the display device according to the embodiment. The control device 1303 controls operation of the imaging device 1302 and the display device. The lens 1301 includes an optical system that focuses light onto the imaging device 1302.

Figure 13B:
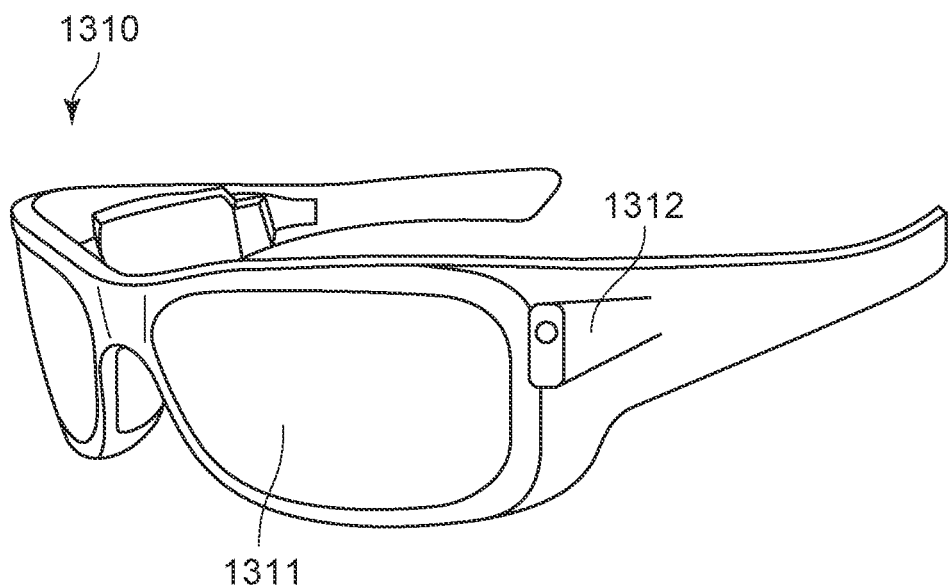

FIG. 13B illustrates glasses 1310 (smart glasses) that are used as an example of the application. The glasses 1310 include a control device 1312. The control device 1312 includes an imaging device that corresponds to the imaging device 1302 and a display device. A lens 1311 includes an optical system that projects light that is emitted from the display device and the imaging device in the control device 1312. An image is projected on the lens 1311. The control device 1312 functions as a power supply that supplies power to the imaging device and the display device and controls the operation of the imaging device and the display device.

Other Embodiments

According to the above embodiments, the arrangement of the pixels in each display device in a plan view is the delta arrangement of the honeycomb structure. However, the arrangement may be stripe arrangement, square arrangement, pen tile arrangement, or Bayer arrangement.

In an example described according to the above embodiments, it is assumed that white light is emitted from the organic layer, and RGB color filters are disposed in the respective pixels. However, organic layers that emit respective RGB colors may be disposed in the respective pixels.

In an example described according to the above embodiments, an organic LED is used as a display element. However, the display element can be an inorganic LED, a liquid-crystal element, or a reflective element, provided that the display element is a light-emitting element. A light-emitting element that uses quantum dots for a light-emitting layer or a light-emitting element that uses quantum dots for a color conversion layer are also acceptable. The materials of the quantum dots are particles of a material such as InP, CdS, PbS, ZnS, or CdSe. Core-shell quantum dots or perovskite quantum dots can be used.

According to the above embodiments, the asymmetrical microlens are used as the optical members. However, a Fresnel zone plate can be used. The Fresnel zone plate is an imaging element that uses a refraction phenomenon of light and is a circular transmission diffraction grating in which transparent and non-transparent concentric rings alternately arranged with respect to incident light. A photolithography technique and a print technique such as nanoimprint can be used for a method of manufacturing the Fresnel zone plate.

According to the present disclosure, a display device that is capable of improving the quality of display can be provided.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A display device comprising:
   a display region in which a plurality of pixels are arranged two-dimensionally on a first face of a substrate; and
   a periphery region,
   wherein each of the plurality of pixels includes a light-emitting layer and an optical member that refracts light from the light-emitting layer,
   wherein the display region includes a first pixel and a second pixel that is located nearer than the first pixel to the periphery region,
   wherein in a cross section surface passing through the substrate, the light-emitting layer, and the optical member, the optical member includes a first point that is located nearer than a top of the optical member to the display region and a second point that is located nearer than the top of the optical member to the periphery region;
   wherein a height of the first point from the first face is equal to a height of the second point from the first face; and
   wherein
      a first line is tangent to the optical member at the first point,
      a second line is tangent to the optical member at the second point, and
      an absolute value of a difference between an angle formed by the first face and the first line and an angle formed by the first face and the second line in a second optical member comprised in the second pixel is larger than an absolute value of a difference between an angle formed by the first face and the first line and an angle formed by the first face and the second line in a first optical member comprised in the first pixel.

2. The display device according to claim 1, wherein
   the display region includes a third pixel that is located nearer than the second pixel to the periphery region; and
   an absolute value of a difference between an angle formed by the first face and the first line and an angle formed by the first face and the second line in a third optical member comprised in the third pixel is larger than the absolute value of the difference between the angle formed by the first face and the first line and the angle formed by the first face and the second line in the second optical member.

3. The display device according to claim 1, wherein
   an angle formed by the first face and the first line is an acute angle;
   an angle formed by the first face and the second line is an acute angle; and
   the angle formed by the first face and the first line is larger than the angle formed by the first face and the second line.

4. The display device according to claim 1, wherein
   an angle formed by the first face and the first line is an acute angle;
   an angle formed by the first face and the second line is an acute angle; and
   the angle formed by the first face and the second line is larger than the angle formed by the first face and the first line.

5. The display device according to claim 1, wherein
   an angle formed by the first face and the first line is an obtuse angle;
   an angle formed by the first face and the second line is an obtuse angle; and
   the angle formed by the first face and the first line is larger than the angle formed by the first face and the second line.

6. The display device according to claim 1, wherein
   an angle formed by the first face and the first line is an obtuse angle;
   an angle formed by the first face and the second line is an obtuse angle; and
   the angle formed by the first face and the second line is larger than the angle formed by the first face and the first line.

7. The display device according to claim 1, wherein the first optical member and the second optical member are in contact with each other.

8. The display device according to claim 1, wherein the first optical member and the second optical member are not in contact with each other.

9. The display device according to claim 1, wherein the optical member has a convex shape toward the substrate.

10. The display device according to claim 1, wherein the optical member has a convex shape away from the substrate.

11. The display device according to claim 1, wherein the plurality of pixels are provided in delta arrangement of a honeycomb structure.

12. The display device according to claim 1,
    wherein the display region is divided into a first block, a second block, and a third block in this order in a direction from a central portion of the display region toward the peripheral portion, and
    wherein a pixel that belongs to the second block includes the first optical member, and a pixel that belongs to the third block includes the second optical member.

13. The display device according to claim 1, wherein the light-emitting layer is an organic layer.

14. The display device according to claim 1, wherein a color filter is disposed between the light-emitting layer and the optical member.

15. The display device according to claim 1, wherein a sealing layer is formed on the light-emitting layer, and the sealing layer is formed by an atomic layer deposition (ALD) method.

16. The display device according to claim 1,
wherein a light-shielding layer is disposed between the first pixel and a pixel adjacent to the first pixel, and
wherein the light-shielding layer is formed above the light-emitting layer.

17. The display device according to claim 1,
wherein the first pixel includes a color filter for a first color, and
wherein a pixel adjacent to the first pixel includes a color filter for a second color, and
wherein a first optical adjustment layer that is included in the first pixel and a second optical adjustment layer that is included in the pixel adjacent to the first pixel have different optical film thicknesses.

18. A display system comprising:
the display device according to claim 1; and
an optical lens system on which light that is emitted from the display device is incident.

19. The display system according to claim 18, wherein the display system is capable of being worn as a wearable device.

* * * * *